(12) United States Patent
Sieg et al.

(10) Patent No.: US 11,456,739 B2
(45) Date of Patent: Sep. 27, 2022

(54) ASSEMBLY FOR A CAPACITIVE SENSOR DEVICE

(71) Applicant: Huf Hülsbeck & Fürst GmbH & Co. KG, Velbert (DE)

(72) Inventors: Berthold Sieg, Bottrop (DE); Daniel Stahl, Wunstorf (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 158 days.

(21) Appl. No.: 16/981,613

(22) PCT Filed: Feb. 27, 2019

(86) PCT No.: PCT/EP2019/054826
§ 371 (c)(1),
(2) Date: Sep. 16, 2020

(87) PCT Pub. No.: WO2019/179729
PCT Pub. Date: Sep. 26, 2019

(65) Prior Publication Data
US 2021/0013883 A1    Jan. 14, 2021

(30) Foreign Application Priority Data
Mar. 21, 2018    (DE) ...................... 10 2018 106 624.4

(51) Int. Cl.
| | | |
|---|---|---|
| H03K 17/955 | (2006.01) | |
| B60R 16/023 | (2006.01) | |
| G01D 5/24 | (2006.01) | |

(52) U.S. Cl.
CPC ....... *H03K 17/955* (2013.01); *B60R 16/0231* (2013.01); *G01D 5/24* (2013.01)

(58) Field of Classification Search
CPC ........ G01R 27/00; G01R 27/02; G01R 27/26; G01R 27/2605; H03K 17/00; H03K 17/94;
(Continued)

(56) References Cited

U.S. PATENT DOCUMENTS

| | | | | |
|---|---|---|---|---|
| 5,880,538 A | * | 3/1999 | Schulz | ................. H03K 17/962 |
| | | | | 327/517 |
| 7,205,777 B2 | * | 4/2007 | Schulz | .................... E05B 81/78 |
| | | | | 324/661 |
| 2017/0373686 A1 | | 12/2017 | Wendt et al. | |

FOREIGN PATENT DOCUMENTS

| | | | | |
|---|---|---|---|---|
| CN | 104081667 A | * | 10/2014 | ............. E05F 15/73 |
| DE | 102012102422 A1 | | 9/2013 | |

(Continued)

OTHER PUBLICATIONS

Baxter, Carrier, In: Capacitive Sensors: Design and Applications, Wiley-IEEE Press, pp. 171-173, Jan. 1, 1997.
(Continued)

*Primary Examiner* — Hoai-An D. Nguyen
(74) *Attorney, Agent, or Firm* — Bret E. Field; Bozicevic, Field & Francis LLP

(57) ABSTRACT

An Arrangement (10) for a capacitive sensor device (20) of a vehicle (1), in particular for control and/or evaluation at the capacitive sensor device (20) for detecting an activating action at the vehicle (1), with at least one sensor electrode (20.1) for sensing a change in a vicinity of the vehicle (1), and with a transmission arrangement (30) for providing an output signal (A) by a frequency-dependent change of an electrical input signal (E) of the transmission arrangement (30), and with an output (30.2) of the transmission arrangement (30), which is electrically connected to the sensor electrode (20.1) in order to operate the sensor electrode (20.1) with the output signal (A), wherein the transmission
(Continued)

Figure 1:
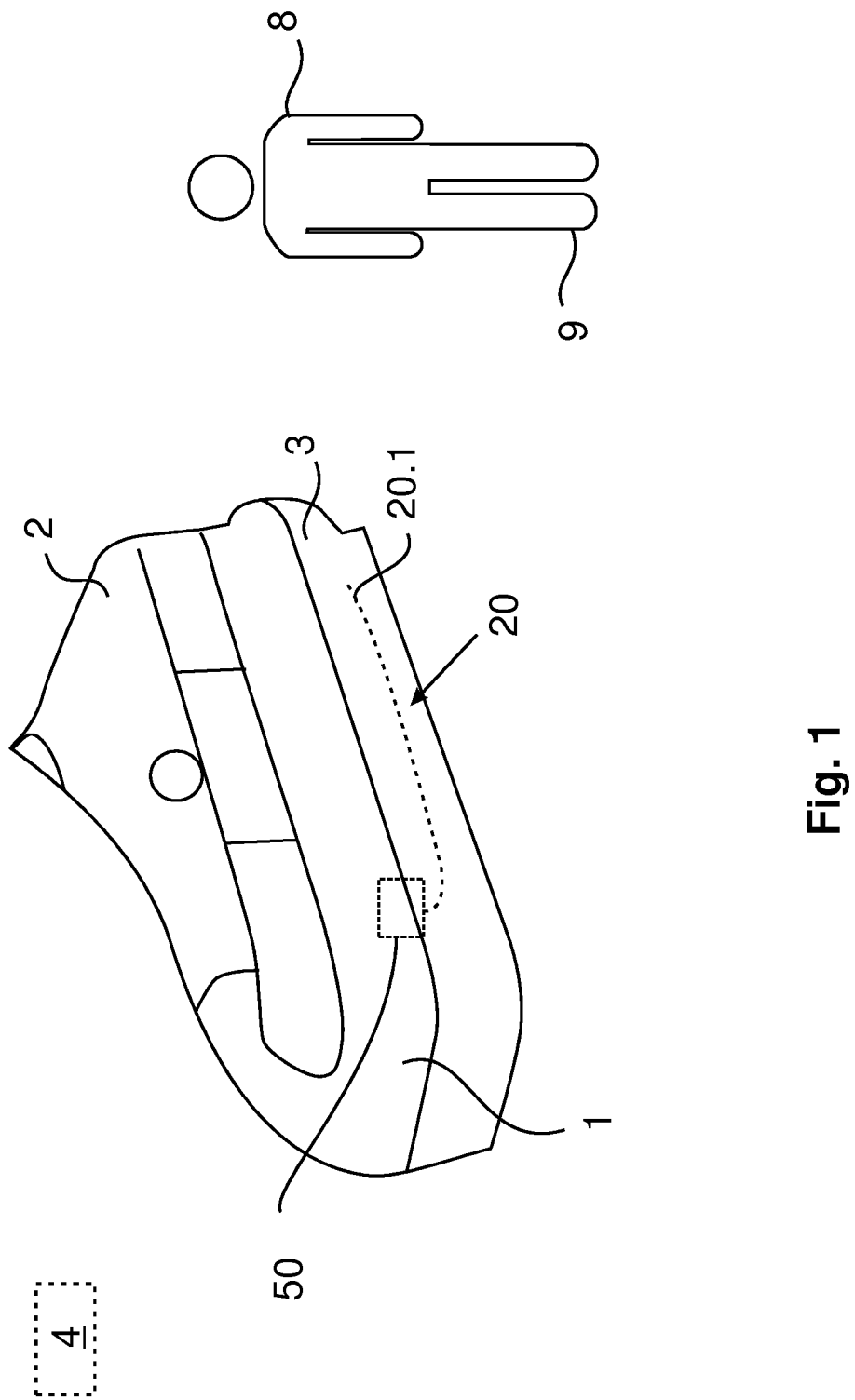

arrangement (30) includes at least one filter component (30.4, 30.5) to perform the frequency-dependent change.

18 Claims, 6 Drawing Sheets

(58) Field of Classification Search
CPC .............. H03K 17/945; H03K 17/955; H03K 2217/00; H03K 2217/94; H03K 2217/96; H03K 2217/9607; H03K 2217/960705; H03K 2217/96071; H03K 2217/960715; H03K 2217/960725; G01D 5/00; G01D 5/12; G01D 5/14; G01D 5/24; B60R 16/00; B60R 16/02; B60R 16/023
See application file for complete search history.

(56) References Cited

FOREIGN PATENT DOCUMENTS

| | | | | |
|---|---|---|---|---|
| DE | 102012105266 | A1 * | 12/2013 | ........... H03K 17/955 |
| DE | 102012105266 | A1 | 12/2013 | |
| DE | 102012224037 | A1 | 6/2014 | |
| KR | 101746122 | B1 * | 6/2017 | ......... G01R 27/2605 |
| KR | 102084728 | B1 * | 3/2020 | .............. B60J 10/80 |

OTHER PUBLICATIONS

Keim, How to Low-Pass Filter a Square Wave, Mar. 7, 2018, pp. 1-9, Retrieved from the Internet: https://www.allaboutcircuits.com/technical-articles/how-to-low-pass-filter-a-square-wave/ [retrieved on May 8, 2019].

* cited by examiner

ASSEMBLY FOR A CAPACITIVE SENSOR DEVICE

The present invention relates to an arrangement for a capacitive sensor device of a vehicle. Furthermore, the invention relates to an external door handle and a method for operating a capacitive sensor device of a vehicle.

It is known from the prior art that a capacitive sensor device with a sensor element can be used on a vehicle to detect changes in the vicinity of the sensor element, such as a movement or an approach of a person. For evaluation of the sensor element, it can be repeatedly charged and discharged, which accordingly involves the output and reception of electrical signals within the sensor device. For this purpose, square wave signals are usually used, which can occur due to recharging and/or switching between a discharging and a charging current path.

For the evaluation of the sensor element, recharging methods are known, for example, as disclosed in DE 10 2012 102 422 A1, DE 10 2012 105 266 A1, DE 10 2013 112 909 A1 or DE 10 2013 112 910 A1.

A common problem is that such a signal for evaluation, and in particular a square wave signal, can comprise a spectrum with unfavourable frequencies. It is therefore conceivable that during recharging by means of the signal at the sensor element, a disturbing radiation may occur. Accordingly, it is often a technical challenge and associated with costly measures to reduce the disturbing effects of the sensor device on the environment. For example, problems can arise due to interactions with radio signals in the range of 510 kHz to 1.71 MHz. Such radio signals are emitted in particular by external transmitters of medium wave broadcasting (in the AM band) or the like. The measures to reduce and/or compensate for these interactions are often technically complex and cost-intensive.

It is therefore an object of the present invention to at least partially eliminate the disadvantages described above. In particular, it is an object of the present invention to enable an improved operation of a capacitive sensor device of a vehicle.

The preceding object is solved by an arrangement with the features of the independent device claim, an external door handle with the features of the further, parallel device claim and a method with the features of the independent method claim. Further features and details of the invention result from the respective dependent claims, the description and the figures. Features and details which are described in reference to the arrangement according to the invention are of course also valid in reference to the external door handle according to the invention, as well as the method according to the invention, and vice versa, so that with regard to the disclosure of the individual aspects of the invention reference is or can always be made to each other.

The object is solved in particular by an arrangement, in particular an electrical circuit arrangement, for a capacitive sensor device of a vehicle, preferably for control and/or evaluation at the capacitive sensor device for detecting an activating action at the vehicle, e.g. in the front and/or side and/or rear region of the vehicle. The activating action can be performed by a person in the vicinity of the vehicle, for example. The person may wish to open a tailgate of the vehicle by a gesture at the rear region. This gesture is e.g. moving a body part underneath a bumper, which can be detected by the sensor device. A gesture in the vicinity of a door handle of the vehicle may also be provided as an activating action, e.g. to unlock and/or open a vehicle door.

Advantageously, the arrangement according to the invention comprises at least one of the following components:
at least one or exactly one sensor element, in particular in the form of a sensor electrode, for sensing a change in a vicinity of the vehicle, in particular in a vicinity of the sensor element, preferably in a region outside the vehicle and/or below a bumper and/or in the region of a door handle, preferably for sensing the gesture and/or the activating action,
a transmission arrangement for providing an output signal by a frequency- and/or phase-dependent change of an electrical input signal of the transmission arrangement, wherein preferably the input signal is provided on an input of the transmission arrangement,
an output of the transmission arrangement, which is (in particular electrically) connected to the at least one sensor electrode in order to operate the sensor electrode with the output signal, preferably by a transmission of the output signal to the sensor electrode.

In particular, it is provided that the transmission arrangement comprises at least one filter component to perform the frequency-dependent change.

This comprises the advantage that the spectrum of the input signal can be adapted by the transmission arrangement, i.e. (undesired) interfering frequencies of the input signal can be filtered out and/or their radiation can be avoided during operation with the output signal, in particular when the output signal is output at the sensor electrode. The solution according to the invention is based in particular on the consideration that the use of a square wave signal as an output signal for the sensor electrode is particularly problematic with regard to possible interference frequencies. Under certain circumstances, it cannot be sufficiently ensured without further measures that the transmission of the output signal and/or the output at the sensor electrode does not comprise any disturbing effects on the output signal and/or electromagnetic radiation at the sensor electrode. This can be avoided by using at least one filter component to form the output signal depending on the input signal. The input signal, for example, as a rectangular signal, specifies an evaluation sequence, i.e. a clock pulse and/or a time sequence of switching processes for at least one switching element. The at least one filter component then effects a forming, i.e. an adaptation with regard to the frequency components at the input signal, e.g. a harmonic suppression. In particular, the transmission arrangement can be adapted, e.g. by a corresponding adaptation of the filter components, so that a sinusoidal signal is output as an output signal. This signal comprises particularly advantageous characteristics with regard to the frequency spectrum.

Advantageously, in the arrangement according to the invention, only a single (structurally designed) sensor electrode can be provided for the formation of a (variable) sensor capacitance, wherein preferably the counter-electrode for the formation of the sensor capacitance is formed by a mass of the vehicle and is therefore not regarded as a separate (dedicated) component. Preferably, parasitic capacitances of the sensor device are neglected. This enables a particularly simple design.

The sensor element, in particular the sensor electrode, can be a sensor element of an electrically conductive material. For example, the sensor electrode is designed as an oblong (elongated) electrical conductor, e.g. as an electrical cable, and optionally only connected to the vehicle electronic system via a single direct electrical connection.

An electrical connection can be either a direct or an indirect connection, i.e. also via other electrical components, but preferably only if the connection is exclusively electrical. For example, the electrical field between the sensor electrode and the vehicle mass cannot be regarded as a direct electrical connection, so that the sensor electrode preferably only comprises a single direct electrical connection to the vehicle electronic system. If necessary, the vehicle electronic system can also be understood as at least the sensor device and/or the monitoring device and/or the transmission arrangement.

The vehicle is preferably a motor vehicle, preferably a passenger car, and/or an electric vehicle and/or a hybrid vehicle and/or an autonomous vehicle.

It is also conceivable that the at least one sensor element, preferably the at least one sensor electrode, is arranged in a front and/or side and/or rear region of the vehicle, in particular in order to sense the change in the vicinity and/or the activating action correspondingly in said vicinity region, i.e. front and/or side and/or rear region of the vehicle. In this way, the activating action in this vicinity region can be reliably detected by the sensor device. For example, the detection can be used to intuitively move or activate elements and/or functions of the vehicle in this vicinity region. Such functions are e.g. lighting of the vehicle and/or unlocking of a locking device of the vehicle and/or similar. The elements can be, for example, a tailgate and/or side door and/or sliding door and/or bonnet, which are moved and/or opened and/or closed on the basis of the detection. It is also optionally possible that the sensor element is arranged on and/or inside or in the region of a door sill(s) in order to open e.g. a side door or sliding door of the vehicle on the basis of the detection. In order to reliably sense a movement and/or a movement pattern by means of the detection, at least two sensor elements, preferably sensor electrodes, may be provided as an alternative or in addition to the above-mentioned features. These are for example arranged together in at least one of the aforementioned vicinity regions, e.g. together in a bumper or door sill or door handle or similar.

Preferably, the capacitive sensor device can comprise the sensor element (or sensor electrode) and/or the transmission arrangement and/or a monitoring device. In the case of the capacitive sensor device, a control can be seen in the fact that the transmission arrangement emits the output signal which is transmitted to the sensor element for charging. The evaluation can be seen in the fact that a holding arrangement of the monitoring device receives charges of the sensor element via a receiving signal, which can be evaluated e.g. for the detection of the activating action. Thus, a holding arrangement of the monitoring device can be advantageously provided for the evaluation of the sensor element (i.e. in particular the sensor electrode), which is evaluated by a control device, if necessary, to enable reliable detection.

Furthermore, in the arrangement according to the invention it may be provided that the at least one filter component influences both an output of the output signal (at the output or on a transmit path) and a reception of charges from the sensor electrode to a holding arrangement (on a receive path) by means of a receiving signal, preferably by the frequency-dependent change. This can be realized, for example, by electrically connecting the holding arrangement to the transmission arrangement.

Another advantage may be that the transmission arrangement is designed as an active electronic filter, preferably as a Sallen Key Filter, by means of the at least one filter component. This comprises the advantage that the output signal is particularly reliable, in particular as a guided signal, which retains the frequency characteristics caused by the at least one filter component.

It may preferably be provided that the transmission arrangement forms an all-pass filter or a low-pass filter by means of the at least one filter component, in order to preferably filter the input signal in such a way that, during operation of the sensor electrode, radiation in a disturbing frequency range, preferably from a second harmonic of the input signal, is at least reduced. In other words, it may be provided that the transmission arrangement is designed to perform a suppression of harmonics of the input signal in order to perform a harmonic suppression at the output of the output signal at the sensor electrode. This comprises the advantage that the transmission arrangement can form a harmonic filter in order to at least reduce interference from the output signal. In particular, the interfering frequency range is a predefined frequency range, and is dependent, for example, on regionally used transmitters and radio frequencies or similar. The harmonic preferably indicates an oscillation with such a frequency, which corresponds to an integer multiple of a fundamental frequency of the input signal. The fundamental frequency is, for example, an operating frequency of essentially 333 kHz. A harmonic above the fundamental frequency is also called a harmonic oscillation or harmonic wave.

In the arrangement according to the invention, it can be provided with particular advantage that the at least one filter component is designed to form an electronic filter, preferably a low-pass and/or band-pass filter, in order to preferably perform the frequency-dependent change of the input signal, wherein particularly preferably the at least one filter component is connected with a source device as a further filter component, so that an active filter, particularly preferably a Sallen key filter, is formed. The source device is for example a controlled source device, in particular a voltage source device. It can be understood as a real electrical component or as an electrical circuit, which approximately comprises the function of an ideal controlled source (engl. also: "dependent source"), in particular a voltage source. Thus, the source device can be understood as a real controlled source, in particular a real voltage source (CVS, engl. "controlled voltage source"). An example of such a source device is an operational amplifier (OP), in particular a controlled, preferably voltage controlled, operational amplifier. It is particularly advantageous if the source device is designed as a (real) low impedance controlled (voltage) source. This comprises the advantage that the output signal as a guided output signal maintains the signal forming particularly reliably.

According to a further possibility, it may be provided that the at least one filter component comprises a first filter component, in particular for forming an RC low-pass filter, and a second filter component, in particular for forming a Sallen Key filter, wherein the filter components are connected with one another in order to jointly perform the frequency-dependent change of the input signal. Preferably the second filter component can also comprise an operational amplifier. This can filter the interfering frequencies particularly reliably, since a sinusoidal signal can be provided.

Advantageously, the invention may provide that the output signal can be provided depending on the frequency-dependent change of the input signal by connecting the at least one filter component between the output and an input of the transmission arrangement. In particular, the provision of the output signal occurs in such a way that the input signal changed by the filter component is applied to a control input of a source device in order to control the source device with regard to the output of the output signal, and an output of the source device is connected or corresponds to the output of the transmission arrangement. Furthermore, feedback may also be provided at the source device, for example to use an operational amplifier as the source device. The operational amplifier may provide an amplification of 1 between an (e.g. non-inverting) input and an output of the operational amplifier.

It may further be possible that an input signal source is connected to an input of the transmission arrangement in order to preferably provide the input signal as a signal based on a square wave signal at the input, which is actively changed, in particular by signal forming, preferably by a looping of the edges of the square wave signal and/or by an amplitude which varies over time, in particular in the case of pulses of the square wave signal within the pulse duration, in order to preferably support the frequency-dependent change, preferably harmonic suppression, of the transmission arrangement. It is advantageous here if the input signal source, preferably a control device and/or a control arrangement, already provides a first signal forming. This can support the further forming by the at least one filter component. For this purpose, a square wave signal (i.e. an at least rectangular signal, possibly with interruptions) is pre-filtered, e.g. by the input signal source, so that a first attenuation of harmonics already occurs, which is further amplified by the transmission arrangement.

It is also optionally conceivable that a control device is provided as part of an input signal source to generate the input signal, preferably via a digital-analogue converter. The digital-analogue converter is, for example, part of the control device and/or is designed separately. Even at this stage of generation, a signal can be provided which differs from a square wave signal, e.g. one which comprises looping of the edges. The generation of the input signal is, for example, specified by an adjusting means.

Furthermore, it is conceivable that for the signal forming of the input signal a control arrangement is provided as part of an input signal source, which is preferably connected between an input of the transmission arrangement and a control device, in order to preferably change an input signal generated by the control device by the signal forming and apply it to the input of the transmission arrangement. In this way, the control arrangement, e.g. as a resistance network or the like, can already be used for forming and/or pre-filtering the input signal.

It may be advantageously provided in the invention that a control device as part of an input signal source is designed to control a control arrangement in such a way that the input signal corresponds to a square wave signal which alternates back and forth between first and second values, wherein preferably the first and second values vary in time in an ascending and descending manner. In other words, successively output pulses of the signal may comprise different (maximum) amplitudes. This can result in a step form for the input signal, which can be particularly effective in supporting the signal forming and/or frequency-dependent change by the at least one filter component.

A further advantage can be obtained in the context of the invention if a switching element is connected between the output of the transmission arrangement and the sensor electrode in order to alternately connect a receive path and a transmit path to the sensor electrode in a controlled manner (preferably controlled by a control device), preferably repeatedly and/or clocked, wherein preferably the output is (in particular directly) connected to the transmit path, and/or a holding arrangement for evaluation at the sensor device is connected (in particular directly) to the receive path. This enables, for example, a recharging method to be performed to evaluate a variable capacitance (sensor capacitance) provided by the sensor electrode. The switching element is, for example, designed as an electronic switch which can be switched electrically by the control device.

Furthermore, in the arrangement according to the invention, it is conceivable that the output of the transmission arrangement is connected to the sensor electrode via at least one switching element, wherein preferably the switching element is connected to a control device in order to output the output signal repeatedly, preferably clocked, at the sensor electrode. For this purpose, the control device can be connected, for example, to a control input of the switching element for switching. Alternatively or additionally it is conceivable that a holding arrangement is connected to the sensor electrode via the at least one switching element, wherein the switching element is connected to the control device in order to connect the holding arrangement to the sensor electrode repeatedly, preferably clocked, preferably alternately to the output of the output signal at the sensor electrode. This enables in particular the performance of a recharging method.

Optionally, it may be provided that a holding arrangement for evaluation at the sensor device is integrated in a receive path in order to receive a receiving signal depending on the charge stored in the sensor electrode and/or depending on a variable sensor capacitance of the sensor device, preferably after the sensor electrode has been charged by the output signal, wherein the sensor electrode is designed to provide the sensor capacitance. This enables to detect an activating action in the vicinity in a simple way, if the sensor capacitance changes significantly.

Furthermore, it may be provided in the context of the invention that the sensor electrode is designed in such a way that it can be arranged in an electrical operative connection with the vicinity of the vehicle, preferably in a bumper or in a door handle of the vehicle, so that during operation of the sensor electrode an electrical field is created in the vicinity to provide a variable sensor capacitance depending on the vicinity. The design of the sensor element as a sensor electrode also comprises particular advantages for such an arrangement in the door handle or bumper, as the sensor electrode can be flexible or bendable or elastic or particularly space-saving.

Furthermore, it may be advantageous within the scope of the invention that a holding arrangement is provided for evaluating a variable sensor capacitance in order to preferably detect the change in the vicinity of the vehicle on the basis of this evaluation, wherein preferably the holding arrangement is designed as an integrator in order to perform in particular a charge accumulation on the basis of a charge stored in the sensor electrode. In other words, by means of a holding capacitance, the holding arrangement can temporarily store a charge quantity (possibly also via a current mirror), which is received by the sensor electrode by means of a receiving signal. Furthermore, the holding arrangement can also comprise a circuit with at least one operational amplifier, which is designed with a frequency-dependent counter-coupling, preferably through at least one capacitor, in order to form the integrator. This enables a particularly simple and cost-effective evaluation.

It is also conceivable that the transmission arrangement is connected to a holding arrangement in order to receive a receiving signal from the sensor electrode depending on the frequency-dependent change at the holding arrangement, preferably in order to provide the frequency-dependent change also for the receiving signal for evaluation at the sensor device, i.e. in particular in order to receive a receiving signal from the sensor electrode depending on the frequency-dependent change. For example, by using a feedback for the evaluation of the receiving signal at the holding arrangement, a signal changed by the at least one filter component can comprise an effect on the receiving signal. This changed signal is guided e.g. via an electrical line from the transmission arrangement to the holding arrangement, e.g. to an integrator input. Thus, the advantageous frequency adaptation by the transmission arrangement can be provided both for the output signal, i.e. for the control, and for the receiving signal, i.e. for the evaluation.

A further advantage may be obtained in the context of the invention when an operational amplifier input of the transmission arrangement (preferably an operational amplifier for providing an active filter) is connected to a (first) integrator input of the holding arrangement in order to preferably receive a receiving signal from the sensor electrode depending on the frequency-dependent change, so that the frequency-dependent change is preferably provided for both the receiving signal in a receive path and the output signal in a transmit path. This connection between the transmission arrangement and the holding arrangement is preferably also used to form the receiving signal during an evaluation, wherein the receive path is preferably connected to a second integrator input of the holding arrangement. In this way, the spectral influence, in particular the suppression of harmonics, can occur both for the output signal and the receiving signal due to the frequency-dependent change. In this way, disturbance can be avoided even further.

It is also conceivable that the transmission arrangement forms a filter with a low-pass characteristic which comprises a limiting frequency in a range of 100 kHz to 800 kHz, preferably 200 kHz to 600 kHz, preferably 400 kHz to 550 kHz, particularly preferably 470 kHz. This can be provided in particular by an appropriate adaptation of the components of the transmission arrangement. Alternatively or additionally, the transmission arrangement may be designed to comprise the filter characteristics of an active low-pass filter, in particular of third order and/or with an attenuation of −20 dB at 1 MHz and/or a limiting frequency of 470 kHz. In other words, a harmonic suppression of at least −20 dB can be provided. The filter is particularly suitable for an operating frequency of the sensor device 20 of (essentially) 333 kHz, which can be determined by the frequency of switching between the recharging phases and/or transmission phases. In particular, harmonics from the second harmonic or third harmonic onwards can be effectively suppressed.

Also an object of the invention is an external door handle for a vehicle, comprising an arrangement according to the invention, wherein the external door handle is designed to be arranged e.g. on a side door or tailgate of the vehicle.

Also protected is a sensor device with the inventive arrangement.

Also protected is a method for operating a capacitive sensor device of a vehicle, in particular for control and/or evaluation at the capacitive sensor device for detecting an activating action at the vehicle, preferably in the side and/or front and/or rear region of the vehicle. Here it is provided that the sensor device comprises at least one sensor electrode for providing a sensor capacitance.

It is advantageous in a method according to the invention that at least one of the following steps can be performed, wherein the steps are preferably performed one after the other in the given order or in any order, and if necessary individual steps can also be repeated:

a) switching at least one switching element to connect a transmit path to the sensor electrode,
b) generating an electrical input signal, in particular at an input of a transmission device, preferably by a control device, such as a microcontroller,
c) performing a frequency-dependent change of the electrical input signal to provide an output signal, preferably at an output of the transmission arrangement, preferably by the transmission arrangement, particularly preferably by at least one filter component,
d) outputting the output signal via the transmit path at the sensor electrode,
e) switching the at least one switching element to connect a receive path to the sensor electrode, and preferably disconnect the connection to the transmit path,
f) transmitting a receiving signal from the sensor electrode to a holding arrangement in the receive path to evaluate the sensor capacitance.

Thus, the inventive method comprises the same advantages as those described in detail with respect to an inventive arrangement. In addition, the inventive arrangement can be operated with the inventive method.

According to a beneficial development of the invention, it may be provided that the frequency-dependent change results in the suppression of harmonics in both the output signal and the receiving signal. This can preferably be achieved by a connection between the holding arrangement and the transmission arrangement. In this way, disturbance can be avoided throughout the operation of the sensor element.

Preferably, the invention may provide that the generation of the electrical input signal as a periodic signal is repeatedly interrupted to provide an interruption phase to pause the output of the output signal and in particular also the transmission of the receiving signal, preferably in such a way that the output signal is output as a burst signal. In other words, after repeated transmissions of the output signal to the sensor electrode and transmissions of the receiving signal from the sensor electrode, a pause can occur. This pause, i.e. the interruption phase, can be performed regularly to reduce energy consumption. In order to make this possible, the control device, for example, outputs a "zero signal" as an input signal, e.g. a voltage of 0 V or similar.

Figure 2:
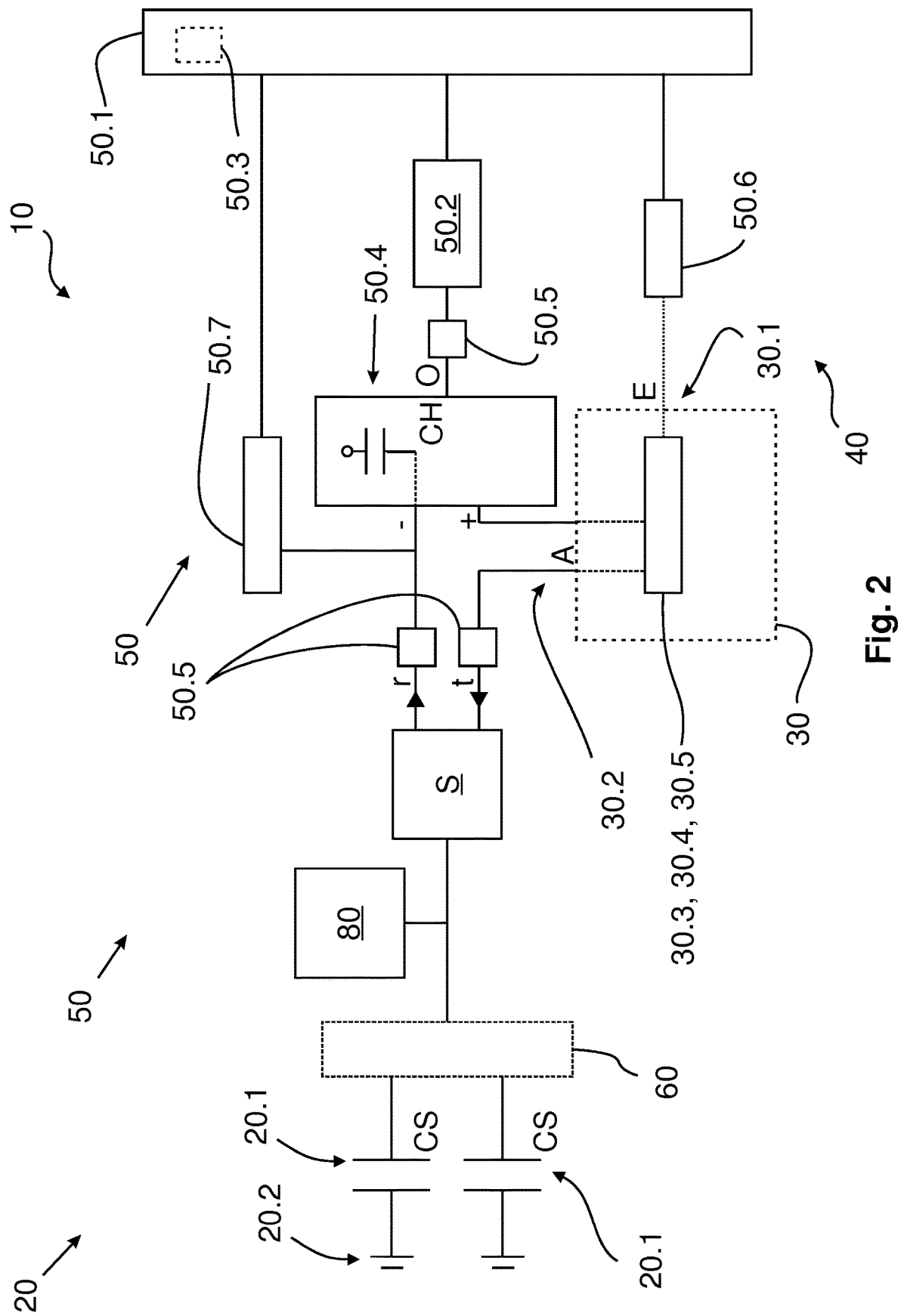
Figure 3:
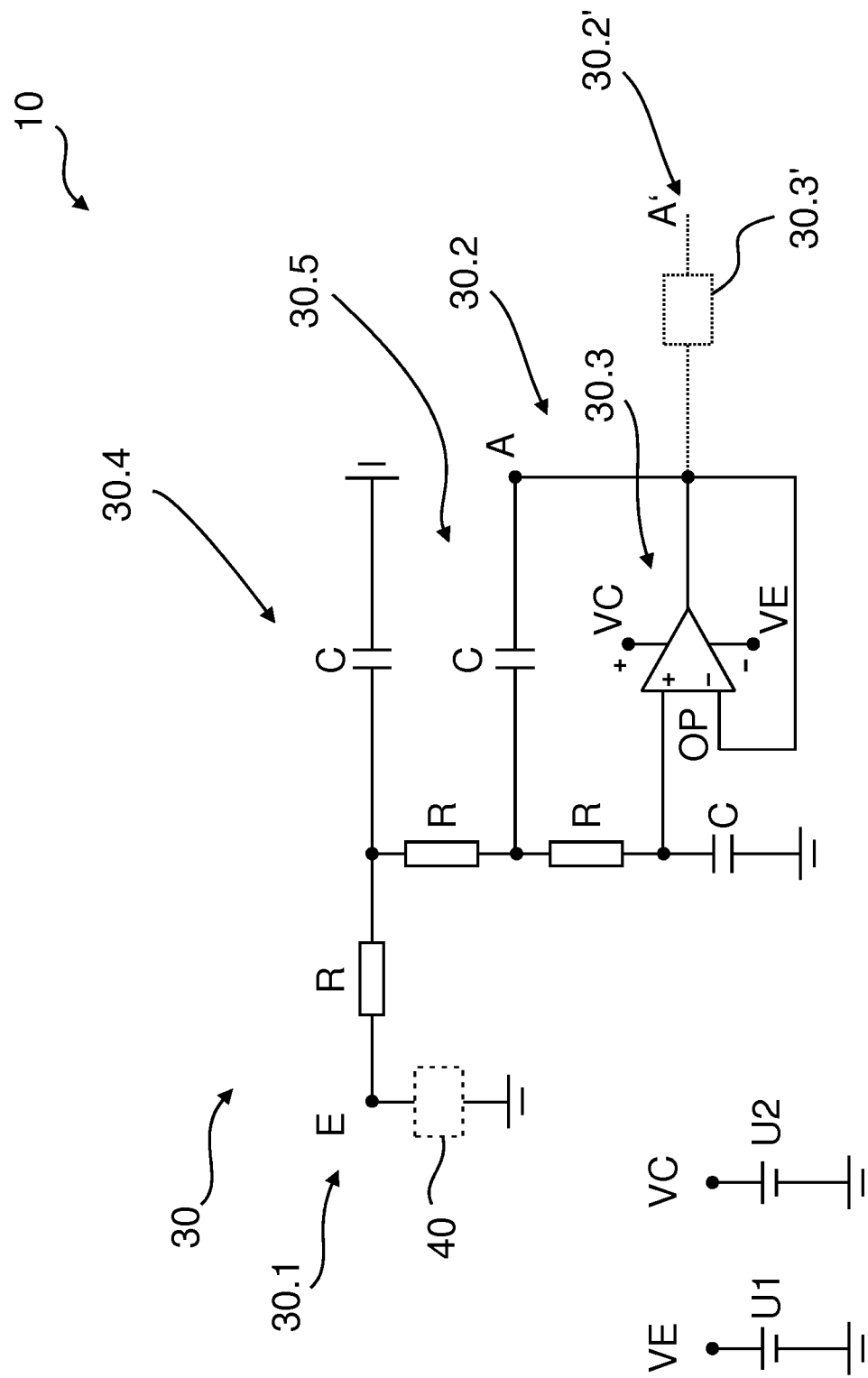
Figure 4:
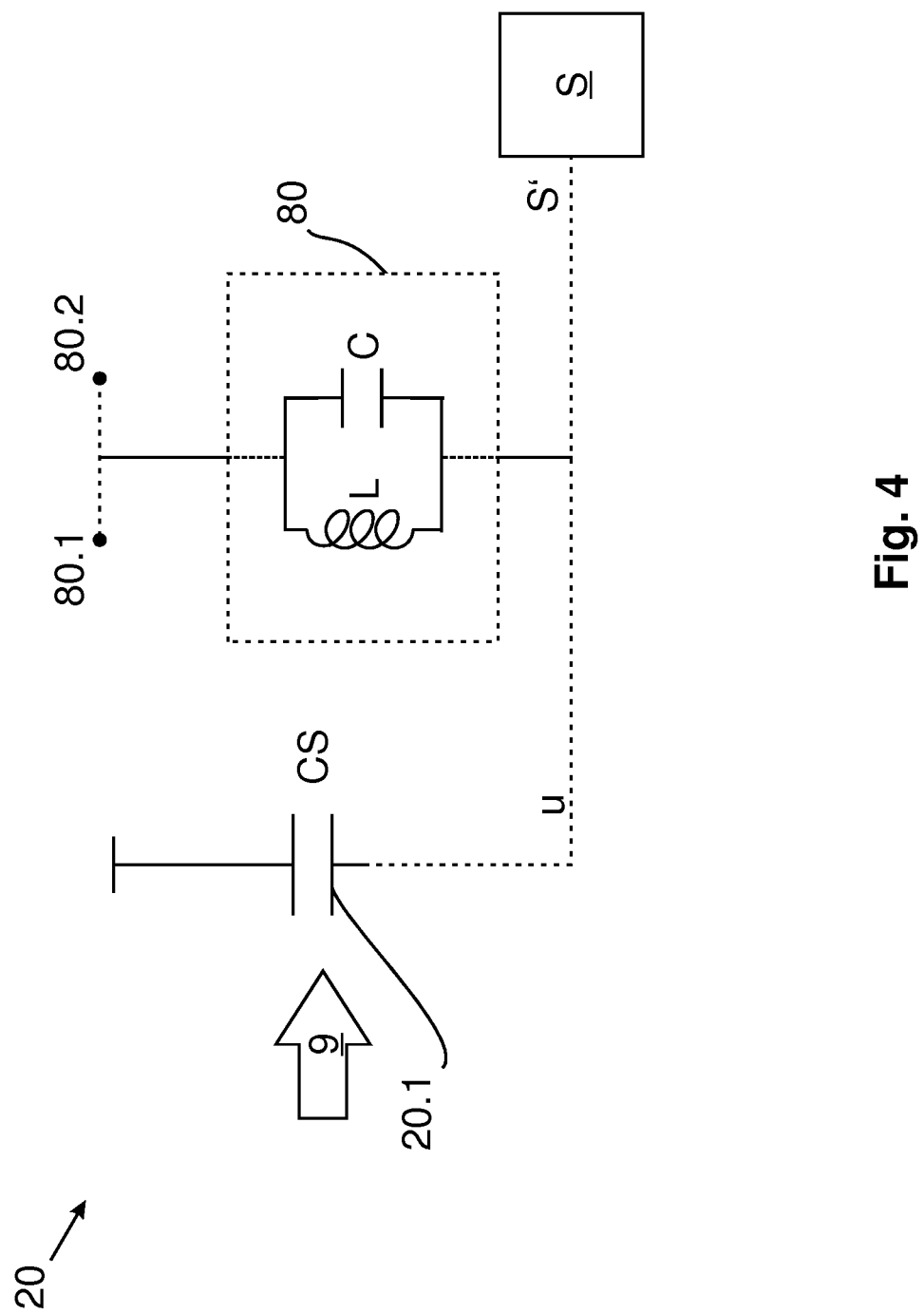
Figure 5:
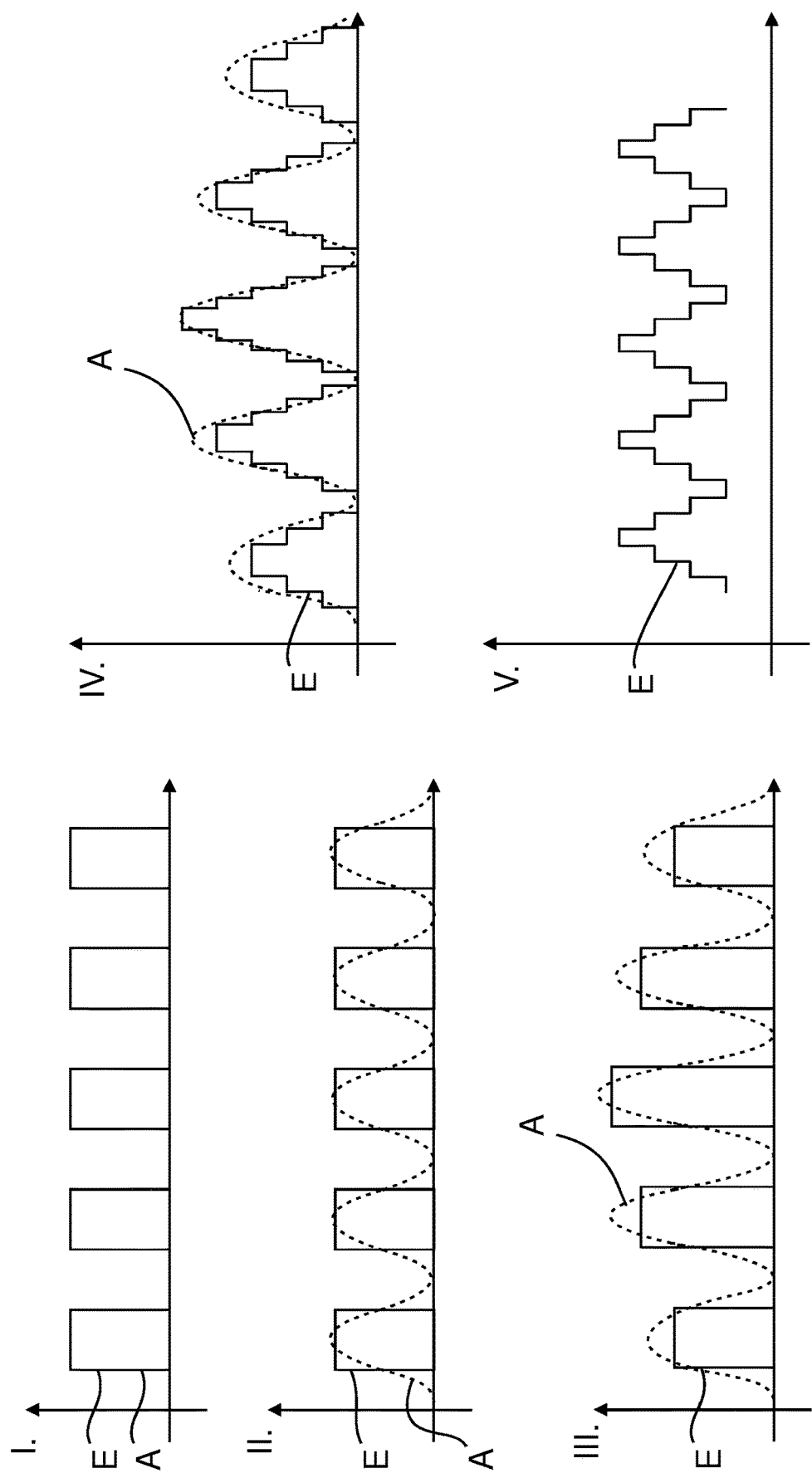
Figure 6:
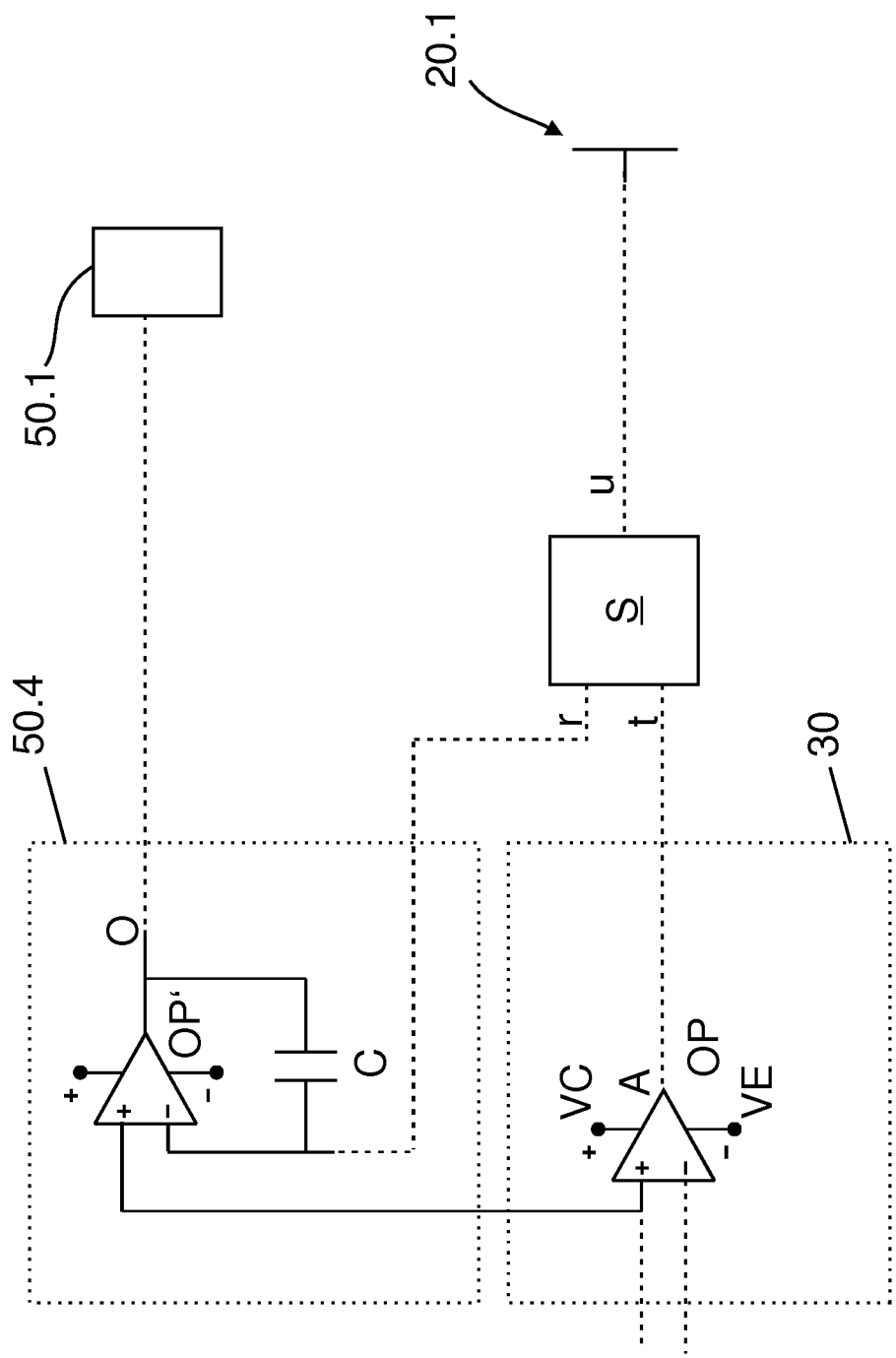

Further advantages, features and details of the invention are given in the following description, in which, with reference to the figures, embodiments of the invention are described in detail. The features mentioned in the claims and in the description can be individually essential for the invention or in any combination. The figures show:

FIG. 1 a perspective representation of a rear of a vehicle with a user,

FIG. 2 a schematic principle circuit diagram of a sensor device,

FIG. 3 a schematic representation of an arrangement according to the invention, FIG. 4 a schematic representation of a sensor device, FIG. 5 schematic representations of signal curves, FIG. 6 a further schematic representation of an arrangement according to the invention.

In the following figures, identical reference signs are used for the same technical features even from different embodiments.

FIG. 1 schematically shows a perspective representation of a vehicle 1. A tailgate 2 is shown above a bumper 3 of the vehicle 1, wherein the tailgate 2 can be opened according to a (first) vehicle function and/or closed again according to a (second) vehicle function. At least one sensor element 20.1, in particular a sensor electrode 20.1 of a capacitive sensor device 20, can be integrated into the bumper 3. Alternatively or additionally, the at least one sensor element 20.1 can also be integrated into an (external) door handle 4 of the vehicle 1 or another vehicle component. The capacitive sensor device 20 accordingly comprises a capacitive sensor which is at least partially formed by the sensor element 20.1. The sensor element 20.1 is preferably of a cable-form and/or designed with an elongated extension in order to provide a sensing region as elongated as possible for sensing an activating action. It is also conceivable that the sensor element 20.1 comprises an extension deviating from an elongated extension, e.g. essentially a circular form or rectangular form or dot form or the like. The activating action is, for example, the movement of an activating means 9, such as a body part 9, in particular a foot 9, of a user 8 in a vicinity outside the vehicle 1 or the sensor element 20.1. To perform the activating action, one possibility is that the user 8 moves the activating means 9 under the bumper 3. This movement is then sensed as a change in a sensor capacitance CS of the capacitive sensor device 20, and can preferably be evaluated and detected by a monitoring device 50 of the sensor device 20. The monitoring device 50 is electrically connected and/or connected to the sensor element 20.1. Accordingly, it can be useful if the monitoring device 50 is designed as a control apparatus of the vehicle 1, preferably as part of—or electrically connected to—the vehicle electronic system. In this case it is conceivable that in order to reduce the switching effort, only a single electrical connection, e.g. a single electrical line such as a cable, leads from the monitoring device 50 to the sensor element 20.1, i.e. the latter is only connected via a single electrically conductive connection. Thus, the sensor element 20 corresponds to a sensor electrode 20.1 for providing the sensor capacitance CS. It is also possible that the activating action is detected by the monitoring device 50, which then activates the vehicle function or at least one of the vehicle functions.

In FIG. 2, the sensing principle for the detection of the activating action and for the evaluation of the sensor capacitance CS is shown in more detail by means of a principle circuit diagram of the capacitive sensor device 20 and an arrangement 10 according to the invention, in particular a circuit arrangement 10. Only one or, if necessary, several sensor elements 20.1 may be provided. Two sensor elements 20.1 in the form of sensor electrodes 20.1, each of which can provide a sensor capacitance CS, are shown as examples in FIG. 2. In other words, a sensor element 20.1 or a sensor electrode 20.1 can each provide a capacitive sensor, which can be regarded as a capacitor. If several sensor elements 20.1 are used, at least one switching device 60 with at least one selective switch can be provided, which alternately selects the sensor elements 20.1, i.e. establishes an electrical connection to them. The at least one switching device 60 connects the sensor elements 20.1 alternately e.g. with a pre-filter arrangement 80 and/or at least one switching element S. The use of at least two sensor elements 20.1 has the advantage that e.g. movements and/or movement patterns can be sensed.

The respective sensor element 20.1 can comprise an electrically conductive material to form a (single) sensor electrode 20.1. To provide the sensor capacitance CS, it is sufficient if only the respective sensor electrode 20.1 is provided without a counter-electrode. In this case the counter-electrodes shown in FIG. 2 (opposite to the respective sensor elements 20.1) are only representative to illustrate the principle and not to be considered as actual components. Alternatively, at least one or, for each sensor element 20.1, an assigned counter-electrode may be structurally provided.

Each sensor element 20.1 can form the sensor capacitance CS with respect to a ground potential 20.2, in particular the vehicle mass, and the vicinity of the vehicle 1. The sensor capacitance CS can thus be changed by the vicinity of the vehicle 1, especially if an activating means 9 moves into the vicinity region of the sensor element 20.1. In this way, an activating action can be sensed very reliably using the sensor capacitance CS.

For the evaluation of the sensor capacitance CS, various methods can be considered. The methods are based in particular on the fact that a recharging of the charge contained in the sensor element 20.1 or stored by means of the sensor capacitance CS to a holding arrangement 50.4 with a holding capacitance CH is performed. The fact that the stored charge depends on the variable sensor capacitance CS and thus on the vicinity of the vehicle 1 (e.g. the activating action) is used. The holding arrangement 50.4 can comprise a holding capacitor which serves for charge accumulation and/or intermediate storage and evaluation of the charge by the monitoring device 50. It is advantageous for the holding arrangement 50.4 to comprise an operational amplifier OP', which, if necessary, forms an integrator with at least one further component and/or a feedback (possibly in the form of a phase- and/or frequency-dependent feedback (e.g. via a capacitor) (see also FIG. 6). The integrator serves to store a charge quantity specific to the charge quantity received by the sensor element 20.1 during recharging via a receiving signal. The operational amplifier OP' can be connected via an output O to a control device 50.1 e.g. in the form of a microcontroller, if necessary via an analogue-digital converter 50.2, in order to evaluate the stored charge quantity.

For recharging, it is advantageous to use a repeatedly performed receiving phase (also called recharging phase). The receiving phase can be a specific switching phase, i.e. a switching state of at least one switching element S. For this purpose, for example, the at least one switching element S, in particular at least one alteration switch S, is repeatedly switched over, preferably at a frequency of 333 kHz. In this case, the receiving phase is present when the switching element S electrically connects a receive path r with the sensor element 20.1. After a further switch of the switching element S to another switching state, however, there is a transmission phase (possibly also called charging phase) in which the switching element S electrically connects a transmit path t with the sensor element 20.1. Both paths r, t can be designed as lines (e.g. on a printed circuit board), which thus provide an electrically conductive connection.

The transmission phase can be used to supply the sensor element 20.1 with charge, i.e. to charge the capacitive sensor. For this purpose, for example, the sensor element 20.1 is electrically connected in the transmission phase via the switching element S and via the transmit path t to a transmission arrangement 30. This causes the transmission of an output signal A via the transmit path t, in particular from the transmission arrangement 30 to the sensor element 20.1. The receiving phase, on the other hand, can be used to receive from the sensor element 20.1 any charge present in it (stored due to the sensor capacitance CS), i.e. to effect the recharging. For this purpose, for example, the sensor element 20.1 is electrically connected in the receiving phase via the switching element S and via the receive path r to a holding arrangement 50.4. This causes the transmission of a receiving signal via the receive path r, in particular from the sensor element 20.1 to the holding arrangement 50.4. In addition, the switching device 60 can also be repeatedly switched over in order to alternately connect the different sensor elements 20.1 with the receive and transmit path r,t.

In the following, the receiving phase is examined in more detail, which can be used for evaluation with the sensor device 20. In the receiving phase the charge stored by means of the sensor capacitance CS can be 'recharged', i.e. depending (e.g. proportionally) on the sensor capacitance CS or the charge stored thereby the holding arrangement 50.4 can be charged with the holding capacitance CH (e.g. of a holding capacitor). The recharging can take place via a low-pass filter 50.5 and/or via a current mirror that is not explicitly shown. The state of charge of the holding arrangement 50.4 or the holding capacitor, which is then relevant for the detection of the activating action, can be determined in particular by means of a voltage across or serially to the holding capacitor, optionally via the analogue-digital converter 50.2. For this purpose, the analogue-digital converter 50.2 can be connected on the one hand to the holding arrangement 50.4 via a low-pass filter 50.5 and on the other hand to the control device 50.1. In addition, optionally at least one further monitoring element 50.7 (also: compensator) can be connected to the receive path r, e.g. to compensate for a charge overflow during recharging. For this purpose, the monitoring element 50.7 can, for example, comprise a regulation circuit. Thus, the monitoring element 50.7 (if necessary together with other elements such as the control device 50.1) can be designed to detect a charge overflow (i.e. if the recharged charge quantity can no longer be stored by the holding capacitance CH) and/or to perform compensation.

The control device 50.1 of the monitoring device 50 can be designed as a microcontroller or similar and, if necessary, also perform the (in particular repeated and/or clocked) switching of the switching element S. In particular, the control device 50.1 can perform this depending on at least one adjusting means 50.3, preferably a computer program, in order to determine and/or vary a phase duration of the receiving phase and/or the transmission phase. In addition, the control device 50.1 can also interrupt the alternate performance of the receiving phase and/or the transmission phase, i.e. introduce a further interruption phase. This is used, for example, to pause the output of an output signal A and/or the transmission of the receiving signal in order to reduce energy consumption, for example.

The principle circuit diagram according to FIG. 2 clarifies that, in particular by the described switching of the switching element S, a square wave signal is produced without further measures for the control and/or evaluation of the sensor element 20.1. This comprises a very broad frequency spectrum. Such an unfavourable frequency spectrum can, without further measures, lead to a disturbing electromagnetic radiation (emission) by the sensor element 20.1 into the vicinity of the vehicle 1, and especially in frequency ranges which can have disturbing effects on other radio signals or the like.

Therefore, as a measure within the scope of the invention, it may be provided that a phase-dependent and/or frequency-dependent transmission and/or change of at least one signal is performed for control and/or evaluation. Thus, for example, for control (i.e. for transmission to the sensor element 20.1 and/or for charging and/or operating the sensor element 20.1), a signal, namely the output signal A, can be output and/or generated directly at an output 30.2 of a transmission arrangement 30, wherein the width of the frequency spectrum of the signal, in particular the harmonics, and thus the interference effect can be reduced by signal forming and/or filtering. As a further signal for evaluation, the receiving signal from the sensor element 20.1 can also be influenced by the phase- and/or frequency-dependent transmission or change, e.g. by connecting the transmission arrangement 30 with the holding arrangement 50.4, in order to thereby control the reception of the receiving signal.

It is also advantageous if the signal and/or the signal forming is influenced by the control device 50.1 and/or by a control arrangement 50.6 connected to and/or integrated in the control device 50.1. These can be connected to an input 30.1 of the transmission arrangement 30 in order to provide an input signal E (in particular a control signal E) for the transmission arrangement 30 at the input 30.1. In this way, the transmission arrangement 30 can be connected between the control device 50.1 and the sensor element 20.1 in order to perform the frequency- and/or phase-dependent transmission or change in the input signal E. This takes place in particular as an advantageous frequency filtering so that the interfering frequencies in the input signal E are predominantly filtered out. For this purpose, the input signal E, if present at the input 30.1 of the transmission arrangement 30, can be filtered and output as the output signal A at the output 30.2. Depending on this transmitted/changed (in particular filtered) input signal E, a guided output signal A can also be output by the transmission arrangement 30. This ensures that the form of the transmitted or changed or filtered signal—and thus the filtered frequency spectrum—is also retained at the sensor element 20.1. By the term "guided" it can be understood in particular that the output signal A is actively generated depending on the transmitted or changed or filtered input signal E and is applied to the sensor element 20.1, e.g. by using an operational amplifier OP.

As shown in FIG. 2 and, with further details, also in FIG. 6, the transmission arrangement 30 can also be connected to an input of the holding arrangement 50.4. In this case, the holding arrangement 50.4 comprises an integrator, for example. As an example, it may thus be provided that an input of the transmission arrangement 30, in particular a non-inverted input "+" of the operational amplifier OP of the transmission arrangement 30, is connected to an input of the integrator, preferably to a (non-inverted) input "+" of a further operational amplifier OP' of the integrator. This connection is preferably designed so that the holding arrangement 50.4 receives the receiving signal from the sensor element 20.1 via the receive path r, depending on the frequency- and/or phase-dependent transmission and/or change by the transmission arrangement 30. For this purpose, a signal provided by the transmission arrangement 30 (e.g. at the input "+" of the operational amplifier OP in FIGS. 3 and 6), which comprises the frequency- and/or phase-dependent change due to filtering, can influence e.g. the function of the holding arrangement 50.4 or the integrator. If the connection is made to the input of the integrator, this provided signal can be interpreted as a kind of reference for integration (e.g. by the connection to the non-inverted operational amplifier input of the integrator, the provided signal influences the differential voltage of this further operational amplifier OP' of the integrator and, if necessary, via a feedback at the operational amplifier OP', thus also the receiving signal). The connection of the components shown in FIG. 6 can correspond to those in FIGS. 2 and 3, as shown by the dotted connecting lines.

FIG. 3 shows the transmission arrangement 30 with further details. The circuit for generating the input signal E, i.e. in particular the monitoring device 50, preferably the control device 50.1 and/or the control arrangement 50.6, is represented schematically by an input signal source 40. This is capable of generating an electrical input signal E, such as at least one input signal E which is essentially designed as a square wave signal or is based on it. If necessary, the control arrangement 50.6 can also perform a further signal forming of the input signal E, e.g. via switchable resistors, in order to form the input signal E. For this purpose, the control arrangement 50.6 can also be controlled by the control device 50.1 to perform the signal forming, e.g. monitored by the adjusting means 50.3. The input 30.1 is electrically connected to at least a first filter component 30.4, in particular an RC element, and/or a second filter component 30.5, in particular further resistors R and/or capacitors C to form a Sallen Key filter. The first filter component 30.4 comprises e.g. a (possibly only) resistor R and a (possibly only) capacitor C. Preferably, by connecting the two filter components 30.4, 30.5 a filter of third order can be provided by the transmission arrangement 30. The use of an operational amplifier OP also allows the design as an active filter, preferably a Sallen Key filter.

In FIG. 2, the control device 50.1 is schematically connected to the control arrangement 50.6 via a line. This serves to simplify the circuit diagram, wherein the line can also be understood as several lines connecting the respective outputs of the control device 50.1 with the respective resistors of the control arrangement 50.6. Thus, for example, the control device 50.1 can be connected to the control arrangement 50.6 via at least one or two or three or four separate electrical lines, in particular to control at least one resistor of the control arrangement 50.6 via each of the lines. Furthermore, the lines can, for example, each connect one output of the control device 50.1 to at least one resistor of the control arrangement 50.6 and preferably connect the respective output electrically to the input 30.1 via the respective resistor(s). For example, the control arrangement 50.6 comprises at least two or three or four resistors, each of which is connected with a first terminal via a respective line to the control device 50.1 and with a second terminal to the input 30.1. Since these are different lines and outputs of the control device 50.1, the resistors can be controlled individually and/or independently of each other to provide the input signal E formed at the input 30.1. In other words, a programmable voltage divider is formed by the control arrangement 50.6. This allows the input signal E to be formed as described in more detail in relation to FIG. 5.

It can be seen that the filter components 30.4, 30.5 may be electrically connected to a source device 30.3, in particular a current and/or voltage source device 30.3. In the example shown in FIG. 3, the source device 30.3 is designed as the operational amplifier OP, which is connected to the filter components 30.4, 30.5 in the sense of a Sallen Key Filter configuration. Accordingly, the operational amplifier OP and/or the source device 30.3 can also be understood as an additional filter component. The source device 30.3 effects an output of an output signal A at the output 30.2 on the basis of the input signal E filtered by the filter components 30.4, 30.5. For active guidance of the output signal A the source device 30.3 is connected to a supply voltage. The following examples show a first voltage U1 for providing a first supply potential VE and a second voltage U2 for providing a second supply potential VC, wherein the voltages are e.g. of the same amount and different polarity. U1 for example is −5 V and U2 for example is +5 V. By appropriate design of the components, a transmission arrangement 30 can be provided which comprises the filter characteristics of an active low-pass filter, in particular of third order and/or with an attenuation of −20 dB at 1 MHz and/or a limiting frequency of 470 kHz. In other words, a harmonic suppression of at least −20 dB can be provided. The filter is particularly suitable for an operating frequency of the sensor device 20 of (essentially) 333 kHz, which is determined by the frequency of the switching between the receiving phases and/or transmission phases. For example, the operating frequency (or other operating frequencies) is determined by the switching frequency of the switching element S or corresponds to it. In particular, harmonics from the second harmonic or third harmonic onwards can be effectively suppressed.

Alternatively, if necessary, the filter components 30.4, 30.5 can be omitted, so that e.g. the transmission arrangement 30 only comprises the controlled source device 30 in order to transmit the input signal E essentially unchanged and then output it as the output signal A (e.g. as a square wave signal) without filtering. Furthermore, the transmission arrangement 30 may also comprise the filter characteristics of an all-pass filter or the like.

A further alternative and/or addition to the inventive arrangement 10 is shown in FIG. 3 in dotted lines. Here, a connection to a further source device 30.3' may be provided at the output 30.2, preferably at the operational amplifier OP and/or the source device 30.3 and/or the at least one filter component 30.4, 30.5, in order to provide an alternative output 30.2'. This design is only optional, for example to use a current source and/or a converter as a further source device 30.3' in order to provide an alternative output signal A'. This design with the further source device 30.3' can be used in addition to the design shown with the operational amplifier OP, or can also replace the source device 30.3'. In the latter case, the filter formed by the filter components 30.4, 30.5 can also be designed as a passive filter and/or the further source device 30.3' can also form a filter component to form an active filter. In principle, the output signal A or A' can therefore be a forcibly actuated sensor voltage or a forcibly actuated sensor current.

FIG. 4 shows the transmission distance of a signal S' between the switching element S and the at least one sensor element 20.1. Within this transmission distance along a transmission path u, further electronic elements may be arranged, which is indicated by a dotted line of the transmission path u. These further elements can e.g. cause a further filtering of the signal S'. Depending on the switching position (switching state), the switching element S connects this transmission distance with the receive path r for evaluation or the transmit path t for control. In a first switching position of the switching element S, the signal S' can thus correspond to the output signal A, which is transmitted from the output 30.2 of the transmission arrangement 30 to the sensor element 20.1. In a second switching position of the switching element S, however, the signal S' can correspond to a receiving signal and be transmitted to the holding arrangement 50.4 via the receive path r. In the latter case, the signal S is specific to the sensing and can be evaluated e.g. by the monitoring device 50 to detect an activating action.

As shown further in FIG. 4, a pre-filter arrangement 80, in particular a pre-selector 80, preferably in the form of a suction circuit and/or a band-pass filter or a band-stop filter (band-stop), can be used. In this way, interfering frequencies of the signal S' can be filtered out, which may be caused by the sensor element 20.1 (in the sense of irradiation or immission). It is clear from this that the sensor element 20.1 can also be regarded as a kind of antenna through which emissions (from the sensor device 20 into the vicinity of the vehicle 1) can escape and immissions (from the vicinity into the sensor device 20) can enter. The terms emissions and immissions are used here to refer to interfering radio signals or electromagnetic radiation. The pre-filter arrangement 80 can, for example, be designed as an LC resonant circuit and/or suction circuit, e.g. with a capacitor C and a coil L connected in parallel. The pre-filter arrangement 80 is connected to a first and second terminal 80.1, 80.2 as an example. It is advantageous if the first terminal 80.1 connects the pre-filter arrangement 80 to a supply potential and/or the second terminal 80.2 connects the pre-filter arrangement 80 to a ground potential. This has the advantage that signal parts of the signal S' in the undesired frequency range can be guided, i.e. discharged, via at least one of these terminals. For this purpose, the pre-filter arrangement 80 becomes low impedance for this possibly undesired frequency range. For the desired frequency, however, the pre-filter arrangement 80 can become high impedance so that the signal S' for this frequency is not guided through the pre-filter arrangement 80 (the pre-filter arrangement 80 thus acts as a band-pass for the desired frequency in such a way that the pre-filter arrangement 80 does not discharge the desired frequency). In the ideal case, i.e. in an operation exclusively with a signal S' of the desired frequency, there is thus no loss due to this filtering. Accordingly, the power loss can be significantly reduced by this design. It is also possible that a resistor and/or a resistor arrangement for the pre-filter arrangement 80 is integrated in the receive path r and the transmit path t, wherein preferably the resistors and/or resistor arrangements are (essentially) designed to be (essentially) the same (with the same resistance value and/or the same size and/or the same impedance). The resistors and/or the resistor arrangements can be designed to adapt a transfer function of the pre-filter arrangement 80.

FIG. 5 shows various possibilities II. to V. for signal forming the input signal E (continuous line) and the resulting output signal A (dashed line). For clarification, representation I. is shown in which no frequency- and/or phase-dependent change and/or only a frequency- and/or phase-dependent transmission of the input signal E is effected by the transmission arrangement 30. In representation II, however, the input signal E is filtered by the transmission arrangement 30, i.e. in particular by the filter components. The filter components preferably provide an analogue low-pass filter which changes the rectangular form of the input signal E. In this way, a sinusoidal output signal A can be provided. Representation III. shows an example of an advanced signal forming in which, in addition to filtering by the filter components of the transmission arrangement 30, a modulation (in particular as a "loop") is also effected by the control device 50.1 and/or the control arrangement 50.6. The input signal E deviates from the original rectangular form and, due to the modulation, shows an amplitude of individual pulses rising and falling in time. This advanced signal forming can, for example, be effected directly when the input signal E is generated by the control device 50.1. A further development is shown in representation IV, where a further modulation is used in addition to the modulation according to III. Here the input signal E comprises a step form which can favour the filtering by the transmission arrangement 30. In other words, according to representation III, the control arrangement 50.6 and/or a control device 50.1 can be designed to perform the forming of the input signal E by generating a square wave signal with sequential pulses in time, wherein the pulse amplitudes of different pulses vary in time, preferably with an amplitude rising and falling again in time (in particular within a burst), wherein the pulse amplitude of individual pulses preferably remains (essentially) constant over the pulse width. In contrast, in representation IV, the pulse amplitude of individual pulses can also change over time within the pulse width, preferably in a step form. In this way, a sinusoidal output signal A can be generated particularly reliably.

A particularly advantageous example of an input signal E is shown in representation V. This signal can be obtained, for example, by signal forming, which is provided by the control device 50.1 and/or the control arrangement 50.6. For this purpose, the control arrangement 50.6 is designed as a programmable voltage divider. The form shown comprises several successive rectangular pulses, which differ from each other in their pulse amplitude. For this purpose, a control signal can be output by the control device 50.1 for the control arrangement 50.6 via the different lines, which are each connected to at least one resistor of the control arrangement 50.6. This is designed, for example, in the form of a pulse width modulation or the like and differs for different lines. The resistances of the different lines are, for example, of different sizes. In this way, the input signal E can be generated very precisely with the desired form. Due to the symmetry of the form, in particular the similar rising and falling pulse sequence and/or the constant absolute value of the amplitude difference for different pulses, a particularly advantageous spectrum can be generated. In particular, the third harmonic in the spectrum of the input signal E can be eliminated (if necessary completely).

The above explanation of the embodiments describes the present invention exclusively in the context of examples. Of course, individual features of the embodiments can be freely combined with each other, provided that it is technically reasonable, without leaving the scope of the present invention.

LIST OF REFERENCE SIGNS 1 vehicle
2 tailgate
3 bumper
4 door handle
8 user
9 body part, activating means
10 arrangement, circuit arrangement
20 sensor device
20.1 sensor electrode, sensor element
20.2 mass potential
30 transmission arrangement
30.1 input
30.2 output
30.3 source device, voltage source device
30.4 first filter component, RC element for low-pass of first order
30.5 second filter component, further arrangement for low-pass of second order
40 input signal source, digital signal generation
50 monitoring device
50.1 control device, microcontroller
50.2 analogue-digital converter
50.3 adjusting means, software
50.4 holding arrangement
50.5 low-pass filter
50.6 control arrangement
50.7 further monitoring element
60 switching device
80 pre-selector, pre-filter
80.1 first terminal, supply terminal
80.2 second terminal, ground terminal
r receive path
t transmit path
A output signal C capacitor
CH holding capacitance
CS sensor capacitance
E input signal
OP operational amplifier
R resistor
S switching element
U1 first voltage
U2 second voltage
VC supply voltage, second potential
VE supply voltage, first potential

The invention claimed is:

1. An arrangement for a capacitive sensor device of a vehicle comprising
at least one sensor electrode for sensing a change in a vicinity of the vehicle,
a transmission arrangement for providing an output signal by a frequency-dependent change of an electrical input signal of the transmission arrangement,
an output of the transmission arrangement, which is electrically connected to the sensor electrode in order to operate the sensor electrode with the output signal,
wherein the transmission arrangement comprises at least one filter component to perform the frequency-dependent change,
wherein an input signal source is connected to an input of the transmission arrangement in order to provide the input signal as a signal based on a square wave signal at the input, which is actively changed in order to support the frequency-dependent change of the transmission arrangement.

2. The arrangement according to claim 1,
wherein
the transmission arrangement is designed as an active electronic filter by means of the at least one filter component.

3. The arrangement according to claim 1,
wherein
the transmission arrangement forms a low-pass filter by means of the at least one filter component in order to filter the input signal in such a way that, during operation of the sensor electrode, radiation in a disturbing frequency range is at least reduced.

4. The arrangement according to claim 1,
wherein
the at least one filter component comprises a first filter component and a second filter component, wherein the filter components are connected with one another in order to jointly perform the frequency-dependent change of the input signal.

5. The arrangement according to claim 1,
wherein
the output signal is provided depending on the frequency-dependent change of the input signal by connecting the at least one filter component between the output and an input of the transmission arrangement.

6. The arrangement according to claim 1,
wherein
a control device is provided as part of an input signal source to generate the input signal.

7. The arrangement according to claim 1,
wherein
for signal forming of the input signal a control arrangement is provided as part of an input signal source, which is connected between an input of the transmission arrangement and a control device, in order to change an input signal generated by the control device by the signal forming and apply it to the input of the transmission arrangement.

8. The arrangement according to claim 1,
wherein
a control device as part of an input signal source is designed to control a control arrangement in such a way that the input signal corresponds to a square wave signal which alternates back and forth between first and second values, wherein the first and second values vary in time in an ascending and descending manner.

9. The arrangement according to claim 1,
wherein
a switching element is connected between the output of the transmission arrangement and the sensor electrode in order to alternately connect a receive path and a transmit path to the sensor electrode in a controlled manner, wherein the output is connected to the transmit path, and a holding arrangement for evaluation at the sensor device is connected to the receive path.

10. The arrangement according to claim 1,
wherein
a holding arrangement for evaluation at the sensor device is integrated in a receive path in order to receive a receiving signal at least depending on the charge stored in the sensor electrode or depending on a variable sensor capacitance of the sensor device, after the sensor electrode has been charged by the output signal, wherein the sensor electrode is designed to provide the sensor capacitance.

11. The arrangement according to claim 1,
wherein
the sensor electrode is designed in such a way that it is arranged in an electrical operative connection with the vicinity of the vehicle, so that during operation of the sensor electrode an electrical field is created in the vicinity to provide a variable sensor capacitance depending on the vicinity.

12. The arrangement according to claim 1,
wherein
a holding arrangement is provided for evaluating a variable sensor capacitance in order to detect the change in the vicinity of the vehicle on the basis of this evaluation, wherein the holding arrangement is designed as an integrator in order to perform a charge accumulation on the basis of a charge stored in the sensor electrode.

13. The arrangement according to claim 1,
wherein
the transmission arrangement is connected to a holding arrangement in order to receive a receiving signal from the sensor electrode depending on the frequency-dependent change at the holding arrangement.

14. The arrangement according to claim 1,
wherein
an operational amplifier input of the transmission arrangement is connected to an integrator input of the holding arrangement in order to receive a receiving signal from the sensor electrode depending on the frequency-dependent change, so that the frequency-dependent change is provided both for the receiving signal in a receive path and the output signal in a transmit path.

15. The arrangement according to claim 1,
wherein
the transmission arrangement forms a filter with a low-pass characteristic, which comprises a limiting frequency in a range from 100 kHz to 800 kHz.

16. An external door handle for a vehicle with an arrangement according to claim 1.

17. A method for operating a capacitive sensor device of a vehicle, wherein the sensor device comprises at least one sensor electrode for providing a sensor capacitance, wherein an arrangement is operable according to claim 1,
wherein the following steps are performed:
a) switching at least one switching element to connect a transmit path to the sensor electrode,
b) generating an electrical input signal,
c) performing a frequency-dependent change of the electrical input signal to provide an output signal,
d) outputting the output signal via the transmit path at the sensor electrode,
e) switching the at least one switching element to connect a receive path to the sensor electrode and disconnect the connection to the transmit path,
f) transmitting a receiving signal from the sensor electrode to a holding arrangement in the receive path to evaluate the sensor capacitance.

18. The method according to claim 17,
wherein
at least the frequency-dependent change results in the suppression of harmonics in both the output signal and the receiving signal or the generation of the electrical input signal as a periodic signal is repeatedly interrupted to provide an interruption phase to pause the output of the output signal.

* * * * *